(12) United States Patent
Tsai

(10) Patent No.: US 7,023,031 B2
(45) Date of Patent: Apr. 4, 2006

(54) CMOS IMAGER HAVING ON-CHIP ROM

(75) Inventor: Richard H. Tsai, Arcadia, CA (US)

(73) Assignee: Micron Technology, Inc., Boise, ID (US)

( * ) Notice: Subject to any disclaimer, the term of this patent is extended or adjusted under 35 U.S.C. 154(b) by 222 days.

(21) Appl. No.: 10/222,827

(22) Filed: Aug. 19, 2002

(65) Prior Publication Data

US 2004/0032627 A1 Feb. 19, 2004

(51) Int. Cl.
H01L 27/115 (2006.01)
H01L 21/8247 (2006.01)
G11C 17/16 (2006.01)

(52) U.S. Cl. ............................ 257/209; 438/132; 365/96
(58) Field of Classification Search ................ 257/208, 257/209, 432, 443, 458, 462, 528, 529; 438/59, 438/66, 128, 132, 467, 601; 365/94, 96, 200
See application file for complete search history.

(56) References Cited

U.S. PATENT DOCUMENTS

| | | | |
|---|---|---|---|
| 3,529,299 A | 10/1966 | Chung et al. | |
| 4,064,493 A | 12/1977 | Davis | |
| 4,152,627 A | 5/1979 | Priel et al. | |
| 4,459,497 A * | 7/1984 | Kuo et al. | 327/51 |
| 4,703,442 A * | 10/1987 | Levine | 384/244 |
| 5,536,968 A * | 7/1996 | Crafts et al. | 257/529 |
| 5,537,108 A | 7/1996 | Nathan et al. | |
| 6,293,465 B1 | 9/2001 | Heller et al. | |
| 6,349,064 B1 * | 2/2002 | Nakaoka | 365/200 |
| 6,396,539 B1 | 5/2002 | Heller et al. | |
| 6,442,094 B1 * | 8/2002 | Shore | 365/222 |
| 6,526,366 B1 * | 2/2003 | Dunton | 702/116 |
| 6,670,824 B1 * | 12/2003 | Goodbread et al. | 326/39 |
| 2003/0007081 A1 * | 1/2003 | Kwon et al. | 348/247 |

* cited by examiner

Primary Examiner—Craig A. Thompson
Assistant Examiner—Jennifer M Dolan
(74) Attorney, Agent, or Firm—Dickstein Shapiro Morin & Oshinsky LLP

(57) ABSTRACT

A CMOS image sensor formed on a chip has a ROM disposed on the chip for recording pixel defect locations, chip-by-chip variations such as bias, and other manufacturing production data. Testing results and repair solutions are written to the ROM after production testing. A simple circuit for writing information to the ROM also is provided on the CMOS chip. During operational use of the image sensor, data is read from the on-chip ROM to assist in compensating for manufacturing process variations.

20 Claims, 2 Drawing Sheets

CMOS IMAGER HAVING ON-CHIP ROM

BACKGROUND OF THE INVENTION

1. Field of the Invention

The present invention relates generally to CMOS image sensors and in particular to a CMOS image sensor provided with an on-chip Read Only Memory (ROM).

2. Brief Description of the Related Art

Image sensing devices are known that employ light detecting elements such as photodiodes or photo-transistors formed using complementary metal oxide semiconductor (CMOS) techniques. The imaging devices generally include an array of pixels containing the light detecting elements arranged on a chip.

Typically, an integrated circuit imaging device formed using a CMOS process has an image sensor pixel array with associated row and column conductors and decoders, an analog signal path including a sample and hold circuit for reading pixel signals from the column conductors, a digital to analog converter for digitizing the analog pixel signals, a controller for controlling array read out operations, a pixel processor for processing digital pixel signals, and an input/output (I/O) port all fabricated on a single chip. The controller manages operation of the read out of the image sensor array, the analog signal path and the analog digital converter, and may also operate as the pixel processor.

During manufacture, each imaging pixel array is usually tested individually. Tests detect defective pixel circuits, pixel signal level, and other array attributes, and the information is stored based on lot and individual device identification numbers. The information developed during testing can be utilized to enhance the operation of the device by, for example, compensating for defective pixels, differing pixel signal levels, and other tested pixel attributes.

U.S. Pat. No. 6,396,539 to Heller et al. discloses a CMOS imager with an on-chip programmable memory for storing pixel and identification information for a CMOS sensor array. The preferred embodiment disclosed by Heller et al., is based on a flash memory, which is complex and bulky. It would be desirable to provide an image sensor having on clip programmable read only memory employing a simple and compact circuit for reading and writing data, and which requires no difficult processing for forming the memory. A simple and easy way to store pixel array information on-chip for later use is also desirable.

SUMMARY OF THE INVENTION

The present invention provides a CMOS image sensor formed on a chip and having a simplified ROM circuit disposed on the same chip for recording pixel information, for example, identification numbers, pixel defect locations, chip-by-chip variations such as pixel signal bias, and/or gain values and other manufacturing and/or test data. Testing results and repair solutions can be written to the ROM during post-production testing. A simple circuit for writing information to, and reading information from, the ROM is also provided.

In an exemplary embodiment, each memory cell of the ROM includes a fusible conductor. The fusible conductors are arranged in an array of rows and columns, with each being connected between a row line and a column line. Preferably, the fusible conductor is formed of polysilicon. Write circuitry is arranged to apply a write voltage selectively to each memory cell through associate row and column conductors, the write voltage being sufficient to break the fusible conductor. Read circuitry applies a read voltage selectively to each memory cell through the associated row and column conductor and determines whether or not the fusible conductor is broken. The write voltage is higher than the read voltage, the read voltage being insufficient to break the fusible conductor. The write circuitry and the read circuitry include an address decoder for the row and column lines for memory cell selection.

In operation, information about the image sensing array such as identification numbers and pixel data obtained during manufacture and/or testing of the pixel array is saved to the on-chip ROM by applying high voltage/current to selected bits. The applied voltage breaks the polysilicon fuse. The broken and unbroken fuses define bit patterns representing the stored information.

These and other features and advantages of the invention will be more clearly understood from the following detailed description which is provided in connection with the accompanying drawings.

DETAILED DESCRIPTION OF THE INVENTION

In the following detailed description, reference is made to the accompanying drawings which form a part hereof, and in which is shown by way of illustration, specific embodiments in which the invention may be practiced. These embodiments are described in sufficient detail to enable those of ordinary skill in the art to make and use the invention, and it is also understood that structural, logical, or procedural changes may be made to the specific embodiments disclosed without departing from the spirit and scope of the present invention.

Figure 1:
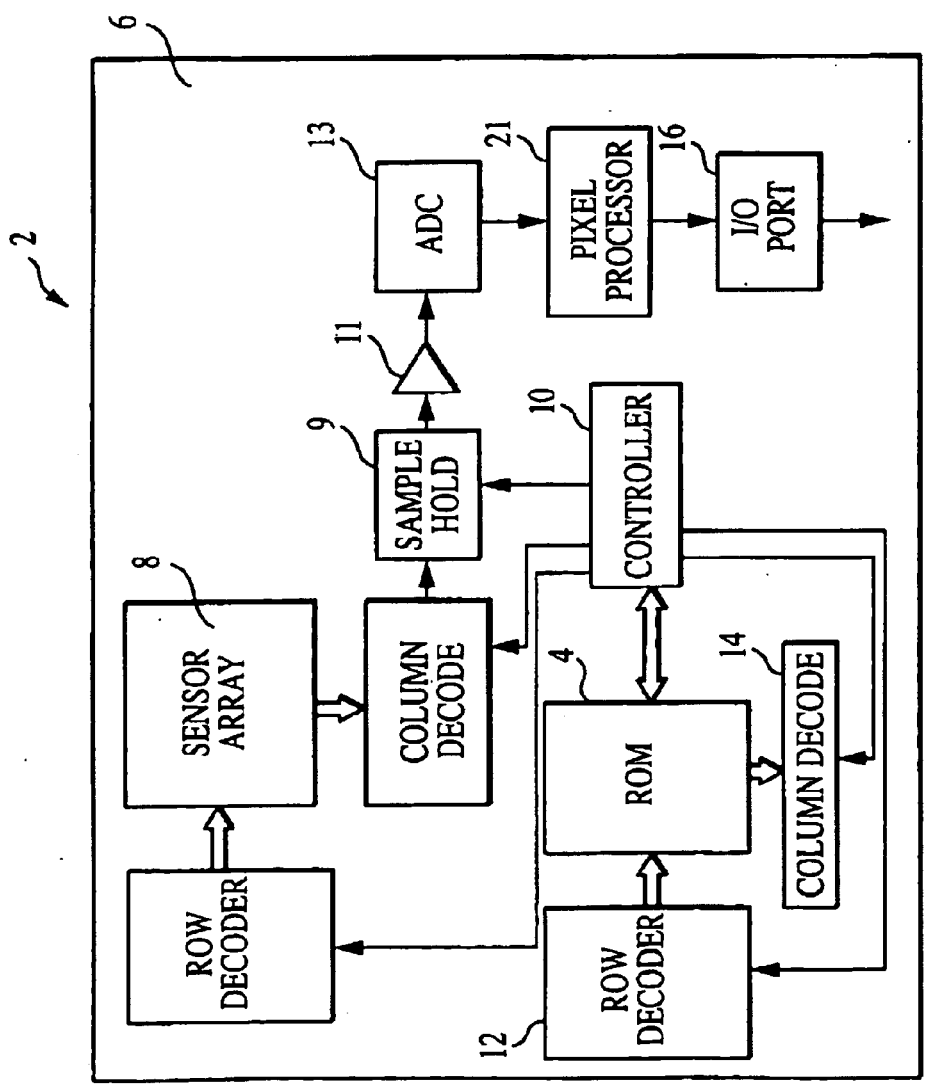
FIG. 1 is a simplified block diagram of an imaging sensor with an on-chip ROM in accordance with an exemplary embodiment of the invention.

Referring initially to FIG. 1, a block diagram is shown of an image sensing device 2 with an on-chip pixel sensor array 8, controller 10, input/output port and associate interface 16 and a ROM 4 in accordance with an exemplary embodiment of the present invention. Imaging sensor 2 preferably is formed by a CMOS process on a semiconductor substrate 6 (e.g., silicon substrate). The pixels within a sensor array 8 may be formed with photodiodes as the light sensing element. Controller 10 operates the row and column decoders and other signals to enable read out of analog pixel read out and charge accumulation signals row-by-row and column-by-column within a row to sample and hold circuit 9 as known in the art. The output of sample and hold circuit is amplified by amplifier 11 and is converted to digital signals by analog-to-digital converter 13. A pixel processor 21 digitally process the pixel information and supplies it to I/O port 16. Controller 10 also accesses memory cells of ROM 4 through a row address decoder 12 and a column address decoder 14. As shown in FIG. 1, ROM 4 is included on semiconductor substrate 6 along with imaging sensor 8 and controller 10 and other imager components.

Figure 2:
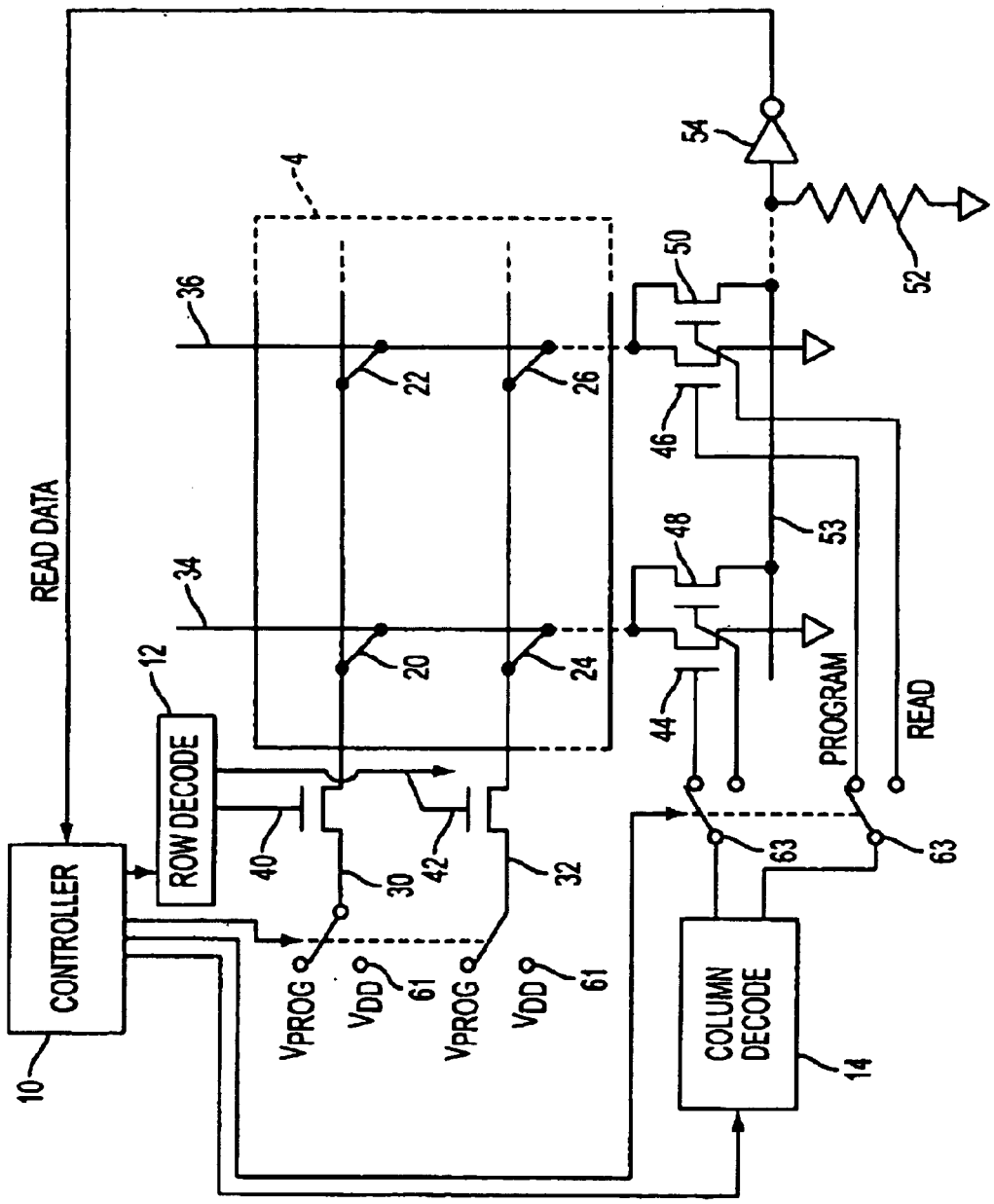
FIG. 2 is a schematic diagram of on-chip ROM and a read/write circuit as used in the imaging sensor of FIG. 1 in accordance with an exemplary embodiment of the invention.

A circuit diagram of a portion of ROM 4 is shown in FIG. 2. ROM 4 includes an array of breakable fuses arranged in rows and columns. Each breakable fuse represents a memory cell of the ROM 4. Representative fuses are designated as 20, 22, 24, and 26 in FIG. 2, although the fuse array can be extended to any number of rows and columns as determined by data storage requirements and space limitations. Each fuse is coupled between a row line and a column line. Fuse 20, for example, is coupled between row line 30 and column line 34. The fuse array is formed on-chip during fabrication of the other components shown in FIG. 1.

Figure 3:
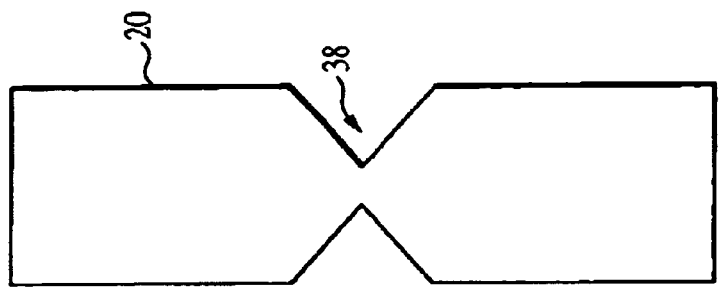
FIG. 3 is a schematic representation of a memory cell fuse used in the imaging sensor of FIG. 1 in accordance with an exemplary embodiment of the invention.

An example of an individual fuse (e.g., fuse 20 of FIG. 2) is illustrated in FIG. 3. Fuse 20 is a conductor formed of, for example, polysilicon, and includes a narrowed portion 38 which is subject to breakage when a high voltage is applied across the fuse. The fuse 20 is shown as having a polysilicon strip portion 38 necked down by a pair of V-shaped notches, providing a simple, easily manufactured fuse arrangement. Other arrangements which allow for fuse severance using an elevated voltage may also be used.

During data storage operations of the ROM 4, individual fuses are selected for writing by way of row and column switching transistors accessed by controller 10 through row and column address decoder 12, 14. Individual rows are selected by way of row access transistors 40 and 42, for example, coupled to rows 30 and 32, respectively. Individual columns are selected by column transistors 44 and 46, having one source/drain connection coupled to columns 34 and 36, respectively and the other source/drain connection connected to ground. When a row transistor and a column transistor are both selected, Vprog, representing a voltage which is higher than a read voltage, is supplied to the fuse, through the row transistor, e.g., 40 and to ground through the column transistor, e.g., 44. Vprog is of sufficient magnitude to break the narrowed section of the polysilicon fuse. Programming continues in this manner until all of the data is stored appropriately in the fuse array as fuse elements which are broken or not in a data information pattern.

Data stored in ROM 4 is accessed by the row and column decoders 12, 14 and reading the selected fuse and/or fuses to determine the stored data. A blown fuse, having a high resistance and a large voltage drop, is read as one logic state (e.g., 1), while a non-blown fuse having a low resistance is read as another logic state (e.g., 0). When a particular fuse is selected for reading, a voltage Vdd is applied to the fuse from the row line, which voltage is lower than the programming voltage Vprog. The contents of the memory cells are (e.g., logic HIGH, or logic LOW) are read column by column onto line 53 by switching transistors 48, 50. Line 53 is connected to inverter 54 which provides a logic output signal in accordance with a broken or unbroken state of read fuses 54.

As best shown in FIG. 2, the programming and read out of ROM memory 4 occurs under control of a program and read out circuit which may conveniently be implemented within controller 10 which supplies row and column addresses for programming and read out functions to row 12 and column 14 decoders, and which controls transistor switches 61 to supply either a programming voltage Vprog or a read voltage Vdd to the source terminals of the row select transistors 40, 42, depending on whether a programming or read out operation is to occur. Controller 10 also controls transistor selection switches 63 to supply a selected column line signal from column decoder 14 to one of a programming column select switch, e.g., 44 or a read column select switch, e.g., 48, again depending on whether a programming or read out operation is to occur. The program and read out circuit for ROM memory 4 can also be implemented independently of controller 10.

Pixel formation which can be stored in the ROM according to the present invention includes identification data concerning manufacturing conditions and test results. Test results can include defective pixel location and types of defects. Information on pixel dark currents can be stored, as well as reference temperature at which the pixels generate a desired output voltage under predetermined illumination conditions. Pixels that generate hot spots on dark spots can also be identified in the ROM, along with data indicating signal intensity. Also, package/die information can be stored, along with camera information when the imager is used with a camera. ROM row or column redundancy information can also be stored in the form of programmed replacement rows or columns of memory elements.

Although breakable fuses formed of polysilicon have been disclosed above, any conductor used in the CMOS process can be used, as long as it can be configured to break under the noted programming conditions and can be read as described.

The present invention provides a simple apparatus and method for storing data regarding a CMOS sensor array 8 in an on-chip ROM 4.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. For example, while the fuse conductors are disclosed as being made of polysilicon, any other suitable material may be used in its place. Accordingly, the invention is not to be considered as limited by the foregoing description but is only limited by the scope of the appended claims.

What is claimed as new and desired to be protected by Letters Patent of the United States is:

1. An imaging system comprising:
  a chip having a sensor array including a plurality of pixels which provide respective signals representative of light incident upon the sensor array; and
  a programmable non-volatile memory located on the chip to store information associated with the sensor array, said memory including:
    rows and columns of addressable fuses connected between a respective pair of row and column lines, each row line being connected to a single respective row access transistor;
    a first column access transistor coupled by a source/drain connection to each respective column line;
    a second column access transistor coupled by a source/drain connection to each respective column line; and
    a control circuit arranged and configured to selectively operate said row and first column transistors to provide a voltage at a first level through a respective row access transistor, a respective first column access transistor, and across a selected fuse sufficient to break the link during a programming operation and for selectively operating said row and first column access transistors to provide a voltage of a second level lower than the first level through the respective row access transistor, a respective second column access transistor, and across the selected fuse link during a read operation.

2. An imaging system as in claim 1, wherein a selected row access transistor applies a voltage at said first level to a respective row line during a programming operation and a selected first column access transistor couples a respective column line to ground during said programming operation.

3. An imaging system as in claim 1, further comprising a plurality of second column access transistors each having one source/drain terminal connected to a respective column line and another source/drain terminal connected to an output line for read out of data from said fuses.

4. An integrated circuit comprising:
   an image sensor for outputting signals representative of input light;
   a programmable non-volatile memory for storing image sensor information; and
   a controller for interfacing with the programmable non-volatile memory and accessing the image sensor information, wherein the non-volatile memory includes:
      a row and column array of individually-addressable fuses, each fuse being connected between a respective pair of row and column lines, each row line being connected to a single respective pair of row and column lines, each row line being connected to a single respective row access transistor;
      a read column transistor coupled by a source/drain connection respectively to each column line of the array,
      a programming column transistor coupled by a source/drain connection respectively to each column line of the array;
      a programming circuit operating said row and column transistors to provide a voltage at a first level through a respective row access transistor and a respective read column transistor, and across a selected fuse during a read operation and a voltage of a second level higher than the first through a respective row access transistor and a selected programming column transistor, and across a selected fuse link, the voltage of the second level being sufficient to break the link during a programming operation.

5. An integrated circuit of claim 4, wherein
   said controller is arranged and configured to function as said programming circuit.

6. The integrated circuit of claim 4, wherein the image sensor comprises a plurality of CMOS pixels.

7. A method of operating an image sensor, the method comprising
   obtaining at least one of manufacturing and testing information for an image sensor fabricated on a semiconductor chip;
   storing the information in a programmable non-volatile memory, made up of a row and column array of individually-addressable fuses fabricated on said chips, by accessing a selected row of the array by way of a row access transistor coupled respectively to said selected row and a selected column of the array by way of a column programming transistor coupled by a source/drain connection respectively to said selected column of the array, and selectively applying a programming potential through a respective row access transistor and a respective column programming transistor across a fuse using the selected row and column which is sufficient to break the selected fuse link for storing information in the memory; and
   reading the information stored in the memory by accessing the selected column by way of a read transistor coupled by a source/drain connection respectively to said selected column and accessing a selected row by way of the row access transistor and applying a read potential lower than the programming potential through the row access transistor and the read transistor, and across a fuse defined by the selected row and column, the read potential being insufficient to break the fuse.

8. An image sensing device comprising:
   an array of CMOS pixels fabricated on a chip;
   a programmable read-only memory fabricated on the chip, the read-only memory including a row and column array of fuses, each row being connected to a single respective row access transistor; a column programming transistor coupled by a source/drain connection respectively to each column of the array of fuses, a selected column programming transistor being used with a selected row access transistor to provide a potential through the selected row access transistor sufficient to break a fuse link associated with the selected row and column;
   a column read transistor coupled by a source/drain connection respectively to each column of the array of fuses, a selected column read transistor being used with the selected row access transistor to provide a read potential lower than the programming potential through the selected row access transistor and the column read transistor to a fuse defined by a selected row and column, the read potential being insufficient to break the respective fuse; and
   access circuitry for writing and reading information to and from the read only memory.

9. An image sensing device as in claim 8, wherein each fuse link is formed of polysilicon.

10. An image sensing device as in claim 9, further comprising control circuitry for selecting individual fuses.

11. An image sensing device as in claim 8, wherein said ROM stores identification information associated with said chip.

12. An image sensing device as in claim 8, wherein said ROM stores pixel defect information.

13. An image sensing device as in claim 12, wherein said ROM stores pixel defect type information.

14. An image sensing device as in claim 8, wherein said ROM stores pixel light sensitivity information.

15. An image sensing device as in claim 8, wherein said ROM stores pixel dark current information.

16. An image sensing device as in claim 8, wherein said ROM stores a reference temperature.

17. An image sensing device as in claim 8, wherein said ROM stores identification of pixels having hot spots.

18. An image sensing device as in claim 8, wherein said ROM stores identification of pixels having dark spots.

19. An image sensing device as in claim 8, wherein said ROM stores information concerning a camera with which said image sensing device is used.

20. An image sensing device as in claim 8, wherein said ROM stores memory redundancy information.

* * * * *

UNITED STATES PATENT AND TRADEMARK OFFICE
CERTIFICATE OF CORRECTION

| | | |
|---|---|---|
| PATENT NO. | : 7,023,031 B2 | Page 1 of 1 |
| APPLICATION NO. | : 10/222827 | |
| DATED | : April 4, 2006 | |
| INVENTOR(S) | : Richard H. Tsai | |

It is certified that error appears in the above-identified patent and that said Letters Patent is hereby corrected as shown below:

Column 5

Lines 4-5, "further comprising a plurality of" should read --each of said--;

Line 5, "transistors each having" should read --transistors having--;

Line 44, "The integrated" should read --An integrated--; and

Line 53, "chips" should read --chip--.

Signed and Sealed this

Twenty-fourth Day of October, 2006

JON W. DUDAS
*Director of the United States Patent and Trademark Office*